(12) United States Patent
Soenen et al.

(10) Patent No.: US 7,990,215 B2
(45) Date of Patent: Aug. 2, 2011

(54) CLASS D AMPLIFIER CONTROL CIRCUIT AND METHOD

(75) Inventors: Eric Soenen, Austin, TX (US); Alan Roth, Austin, TX (US); Justin Shi, Austin, TX (US); Martin Kinyua, Austin, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/858,310

(22) Filed: Aug. 17, 2010

(65) Prior Publication Data

US 2011/0006844 A1 Jan. 13, 2011

Related U.S. Application Data

(63) Continuation of application No. 12/197,967, filed on Aug. 25, 2008, now abandoned.

(51) Int. Cl.
*H03F 3/217* (2006.01)
(52) U.S. Cl. .......................................... 330/251; 330/10
(58) Field of Classification Search .................. 330/10, 330/207 A, 251
See application file for complete search history.

(56) References Cited

U.S. PATENT DOCUMENTS

| | | | |
|---|---|---|---|
| 6,552,606 B1 * | 4/2003 | Veltman et al. | 330/10 |
| 6,693,400 B2 | 2/2004 | Pedrazzini et al. | |
| 6,952,131 B2 | 10/2005 | Jeong et al. | |
| 7,119,525 B1 | 10/2006 | Yoshino | |
| 7,200,187 B2 | 4/2007 | O'Brien | |
| 7,239,116 B2 | 7/2007 | Tang | |
| 7,276,963 B2 | 10/2007 | Wegner | |
| 7,391,197 B2 | 6/2008 | Chang et al. | |
| 7,394,314 B2 | 7/2008 | May | |
| 7,459,864 B2 | 12/2008 | Lys | |
| 2003/0174005 A1 | 9/2003 | Latham, II et al. | |
| 2006/0220938 A1 | 10/2006 | Leung et al. | |

(Continued)

FOREIGN PATENT DOCUMENTS

CN 1618168 A 5/2005

(Continued)

OTHER PUBLICATIONS

Reutemann, R., et al., "A 33mW 14b 2.5MSample/s ΣΔ A/D Converter in 0.25μm Digital CMOS," IEEE ISSCC 2002, Session 18, Converter Techniques, 18.6, 3 pages.

(Continued)

*Primary Examiner* — Khanh V Nguyen
(74) *Attorney, Agent, or Firm* — Slater & Matsil, L.L.P.

(57) ABSTRACT

Circuit and method for a Class D amplifier. In one exemplary embodiment, an audio amplifier is disclosed. A closed loop configuration for driving high and low side driver transistors is provided, each circuit is compatible with advanced sub micron semiconductor processes. The analog time varying input is coupled to one input of a sigma delta analog to digital converter. A feedback signal from the output is also input to the analog to digital converter. A bit stream is output by the analog to digital converter. A decimator receives this bit stream and downconverts the samples to digital values at a lower frequency. A digital filter with adaptable coefficients is used to filter that signal and a digital pulse width modulator then develops an analog differential PWM signal. A predriver inputs the PWM signal and derives the output gating signals to control the high and low side drivers of a Class D amplifier.

33 Claims, 7 Drawing Sheets

U.S. PATENT DOCUMENTS

2008/0129264 A1    6/2008    Moussaoui et al.

FOREIGN PATENT DOCUMENTS

CN          1925292 A      3/2007

OTHER PUBLICATIONS

Pressman, A.I., "'Buick' Switching Regulator Topology", Switching Power Supply Design, $2^{nd}$ Ed., McGraw-Hill, © 1998, pp. 9-24.

Pressman, A.I., "Feedback-Loop Stabilization", Switching Power Supply Design, $2^{nd}$ Ed., McGraw-Hill, © 1998, pp. 427-448.

Texas Instruments, "DC/DC Converters (Integrated Switch)—Step-Down Regulators"—TPS62000, http://focus.ti.com/docs/prod/folders/print/tps62000.html, Texas Instruments Incorporated, Dallas, TX, 1995-2010, 4 pages.

Texas Instruments, TPS62000 Data Sheet, "High-Efficiency, Step-Down, Low Power, DC-DC Converter (Rev. E)," http://focus.ti.com/docs/prod/folders/print/tps62000.html; Aug. 18, 2008, © 2000-2008, Texas Instruments Incorporated, Dallas, TX, 26 pages.

Texas Instruments, "DC/DC Converters (Integrated Switch)—Step-Down Regulators"—TPS62040, http://focus.ti.com/docs/prod/folders/print/tps62040.html, Texas Instruments Incorporated, Dallas, TX, 1995-2010, 5 pages.

Texas Instruments, TPS62040 Data Sheet, "1.2A / 1.25 Mhz. High-Efficiency, Step-Down Converter (Rev. B)," http://focus.ti.com/docs/prod/folders/print/tps62040.html, Oct. 28, 2005, © 2003-2005, Texas Instruments Incorporated, Dallas, TX, 29 pages.

Texas Instruments, "DC/DC Converters (Integrated Switch)—Step-Down Regulators"—TPS 62220, http://focus.ti.com/docs/prod/folders/print/tps62220.html, Texas Instruments Incorporated, Dallas, TX, 1995-2010, 5 pages.

Texas Instruments, TPS62220 Data Sheet, "400-mA, 1.25-MHz High-Efficiency Step-Down Converter in Thin-SOT23 (rev. E)," http://focus.ti.com/docs/prod/folders/print/tps62220.html, Feb. 5, 2009, Copyright © 2003-2009, Texas Instruments Incorporated, Dallas, TX, 29 pages.

Texas Instruments, "DC/DC Converters (Integrated Switch)—Step-Down Regulators"—TPS62260, http://focus.ti.com/docs/prod/folders/print/tps62260.html, Texas Instruments Incorporated, Dallas, TX, 1995-2010, 6 pages.

Texas Instruments, TPS62260 Data Sheet, "2.25MHz 600mA Step Down Converter in 2x2SON/TSOT23 Package (Rev. B)," http://focus.ti.com/docs/prod/folders/print/tps62260.html, Feb. 19, 2008, Copyright © 2007-2008, Texas Instruments Incorporated, Dallas, TX, 31 pages.

Analog Devices, ADP2102, "Low Duty Cycle, 600mA, 3MHz Synchronous Step-Down DC-to-DC Converter," http://www.analog.com/en/power-management/switching-regulators-integrated-fet-switches/ADP2102/products/product.html, 2007 Analog Devices, Inc., Norwood, MA, 2 pages.

Analog Devices, ADP2102 Data Sheet, "Low Duty Cycle, 600mA, 3MHz Synchronous Step-Down DC-to-DC Converter," Rev. B, http://www.analog.com/en/power-management/switching-regulators-integrated-fet-switches/ADP2102/products/product.html, Sep. 2007, © 2007 Analog Devices, Inc., Norwood, MA, 24 pages.

Coilcraft, LPS3015 Series Data Sheet, "Low Profile Shielded Power Inductors," http://www.coilcraft.com/lps3015.cfm, Doc. 436-1, Revised Aug. 5, 2009, © Coilcraft, Inc. 2010, Cary, IL, 2 pages.

Maxim, MAX8640Y/MAX8640Z Data Sheet, "Tiny 500mA, 4MHz/2MHz Synchronous Step-Down DC-DC Converters," http://datasheets.maxim-ic.com/en/ds/MAX8640Y-MAX8640Z.pdf, 19/3997; Rev 4; Feb. 2009, © 2009 Maxim Integrated Products, Sunnyvale, CA, pp. 1-12.

Linear Technology, LTC3614 Data Sheet, "4A, 4MHz Monolithic Synchronous Step-Down DC/DC Converter," http://cds.linear.com/docs/Datasheet/3614f.pdf, © Linear Technology Corporation 2010, Milpitas, CA, pp. 1-28.

Lukić, Z, et al., "High-Frequency Digital Controller for DC-DC Converters Based on Multi-Bit Σ-Δ Pulse-Width Modulation," 2005, pp. 35-40, Canada, IEEE.

Lukié, Z, et al., "Multibit Σ-Δ PWM Digital Controller IC for DC-DC Converters Operating at Switching Frequencies Beyond 10 MHz," IEEE Transactions on Power Electronics, Sep. 2007, pp. 1693-1707, vol. 22, No. 5, IEEE.

Parayandeh, A., et al., "Programmable Analog-to-Digital Converter for Low-Power DC—DC SMPS," IEEE Transactions on Power Electronics, Jan. 2008, pp. 500-505, vol. 23, No. 1, IEEE.

Dostal, F., "Emulated Ripple Technique Advances Hysteretic Switchmode Supplies," Feb. 25, 2008, Power Management DesignLine, http://www.powermanagementdesignline.com, 4 pages.

Forejt, B., et al., "A 700+-mW Class D Design With Direct Battery Hookup in a 90-nm Process"; IEEE Journal of Solid-State Circuits, vol. 40, No. 9, Sep. 2005; pp. 1880-1887.

\* cited by examiner

CLASS D AMPLIFIER CONTROL CIRCUIT AND METHOD

This application is a continuation of patent application Ser. No. 12/197,967, entitled "Class D Amplifier Control Circuit and Method," filed on Aug. 25, 2008, which application is incorporated herein by reference.

RELATED APPLICATIONS

The present application is related to U.S. patent application Ser. No. 12/197,790 (TSM07-0765), which was filed Aug. 25, 2008, entitled "Digital Control of Power Converters", which patent application is hereby incorporated by reference in its entirety.

TECHNICAL FIELD

The present invention relates to a circuit and method for providing an improved Class D amplifier using an amplifier control circuit.

BACKGROUND

Certain circuits require analog signal processing for operation. Examples include driver circuits for Class D amplifiers. Typically, the driver circuit outputs gating signals for a high and a low side drive. These can be, for example, power devices such as power MOSFET transistors that are coupled to the load. Often, the driver circuit may be provided as an integrated circuit. Additional functions such as over current protection, overload protection, over temperature protection, test functions and other system functions may be included in such an integrated circuit. In a typical application, the driver control circuit receives an analog input signal to be output to a load, and the control circuit also monitors the output to the load with an analog feedback signal that corresponds to the output signal. Feedback control circuitry is used to adjust the high and low driver gating signals output by the control circuit to compensate the circuit for proper operation.

Class D amplifiers are preferred for many applications because the full "on" or full "off" characteristic of the gating signals ensures that the driver portion of the circuit is very efficient. Advantageously, in the Class D amplifier neither the high side nor low side MOSFET driver transistor is operated in the so-called "linear" fashion. The driver transistor gating signals are arranged so that the transistor is either fully ON or OFF. The operation range where the transistor is in the "active" mode, and therefore forms an impedance, is avoided. This approach avoids the heat generating resistive operation that transistors biased in the linear mode produce.

Further, in most typical prior Class D circuits, the control circuitry sets up a short "dead time" between transitions from a point where the high side driver is on, to where the low side driver on. The purpose of the "dead time" is to avoid "shoot through" currents. In shoot through, the high side and low side drivers are both temporarily on, producing a current path from the positive voltage supply to the ground or negative voltage supply terminal; this results in lost power and very inefficient circuit operation. By using a dead time control scheme, the shoot through phenomenon is reduced. The fact that the amplifier transistors are always operated in their most efficient modes may also eliminate the need for expensive and area consuming heat shields and fans to cool the circuit. In contrast, other circuit topologies such as Class A, Class B, or Class A/B may often require these cooling approaches.

The Class D amplifier is particularly often used as a low frequency amplifier due to the high efficiency and low heat dissipation characteristics. A particular low frequency amplifier application is as an audio amplifier. A Class D amplifier in an audio application receives as its signal input an input signal at a frequency in the human audible range, a low frequency time varying signal of not more than 20 kHz. Typically, in a known amplifier circuit, this input is then compared with a much higher frequency signal from a sawtooth or other ramp signal generator. A resulting pulse width modulated (PWM) signal of a square wave form is generated using a comparator. This PWM signal is then used to form the switching signals and the gating signals for the driver transistors. These signals will be of frequency equal to the ramp or sawtooth. This PWM signal is used to form the high and low driver gating signals for the amplifier transistors.

FIG. 1 illustrates in a simplified circuit diagram a Class D audio amplifier of the prior art. In FIG. 1 an audio input source 11 provides a differential voltage input, with the signal in the audible range of approximately 20 Hz-20 kHz. Analog integrator 13 then outputs a differential integrated signal to the comparators 19 and 17 which output a differential pulse width modulated (PWM) signal to the h-bridge, and then to PMOS and NMOS driver circuits in IC 21. In this non-limiting amplifier example, the circuit outputs then drive a conventional 8 or 4 ohm speaker 23, for example, as a load. As is known in the art, if a ramp generator 15 is used to drive the comparators, a PWM output signal results with the same frequency as the ramp or sawtooth frequency.

As is known to those skilled it the art, the Class D amplifier is sometimes referred to as a "digital" amplifier, although strictly speaking, that term is not accurate. This merely means that the power transistors in the driver IC 21 in FIG. 1 are operated fully ON or fully OFF.

While the Class D audio amplifier of the prior art is effective, there are several aspects to the prior art circuit that make it unattractive for integration into present day integrated circuits. Analog components such as are required by the analog integrator and the ramp generator of FIG. 1 are difficult to reliably produce with sufficient precision in present day semiconductor manufacturing processes, such as 45 nanometer and smaller minimum feature size semiconductor manufacturing technologies. Further, these advanced ultra deep submicron semiconductor processes are often optimized for manufacturing digital signal level circuits, not precision analog circuitry. The designed-for core supply voltages are quite low; core voltage supply levels used in present day integrated circuits are dropping and are presently around 1 Volt and trending lower. This low supply voltage level makes accurate amplifier design for amplification of a larger voltage swing input signal very difficult. The designed values of passive components such as capacitors and resistors used in precision analog circuitry can be subject to variations in the process, temperature, or other effects. Variations in the values of these components make control of a feedback loop very difficult, and as is known to those skilled in the art, loop control is necessary to maintain stability in such a feedback system to prevent the analog loop control circuit from oscillating, for example.

Thus there is a continuing need for an improved Class D amplifier that is compatible with advanced sub micron semiconductor processes. The circuit should be configured with a minimal amount of required passive or precision analog components, and should have a process and voltage tolerant loop control function. The Class D amplifier circuit should be adaptable so as to avoid circuit reliability problems associated with component value changes due to process variations, and temperature, supply voltages, load current variations or other variances in the environment where the circuit is used.

SUMMARY OF THE INVENTION

These and other problems are generally solved or circumvented, and technical advantages are generally achieved, by embodiments of the present invention, which provides circuits and methods providing a Class D amplifier control circuit using primarily digital circuitry and circuitry that is compatible with advanced semiconductor processes and low core supply voltages. The control circuit is particularly useful for implementing a Class D amplifier for low frequency time varying input signals, such as audio signals. Other Class D amplifier applications may also benefit by the use of embodiments of the invention, such as R/F, I/F, and ultra-sound applications.

In an exemplary embodiment of the invention, a Class D amplifier control circuit is provided comprising an input for receiving a time varying input signal of a low frequency, a feedback path for coupling the analog output signal to a low pass filter, an analog to digital converter coupled to the time varying input and further coupled to the low pass filtered feedback signal that outputs a digital value representing the magnitude of a difference between the input signal and the low pass filtered feedback signal; a digital filter coupled to receive and amplify the digital value using programmable coefficients to output digital filter signals; a digital to analog converter for generating a pulse width modulated output signal with a pulse width (magnitude) corresponding to the digital filter output signals; and a predriver circuit coupled to the pulse width modulated output signal outputting driver gate control signals for a high side and low side driver of a Class D amplifier. In another exemplary embodiment, the above described Class D amplifier control circuit is provided wherein the frequency of the input signal is in the human audible frequency range. In another embodiment of the above described Class D amplifier control circuit, the analog to digital converter comprises a sigma delta analog to digital converter. In a further embodiment of the above described Class D amplifier control circuit, the circuit further comprises a decimator coupled between the sigma delta analog to digital converter and the digital filter.

In yet another embodiment, a Class D amplifier control circuit is provided, receiving a time varying input signal and a feedback signal into a sigma delta analog to digital converter, wherein the sigma delta analog to digital converter further comprises a two branch input switched capacitor circuit that receives the time varying input signal into a first branch and the analog feedback signal into a second branch, which samples the first and second branch during a first phase of a two phase non-overlapping clock signal and which integrates the sampled voltage during the second phase of the two phase non-overlapping clock signal. In a further embodiment of the Class D amplifier control circuit with a sigma delta analog to digital converter, the sigma delta analog to digital converter further comprises a common mode rejection circuit. In yet another embodiment of the Class D amplifier control circuit with a sigma delta analog to digital converter described above, the analog to digital converter circuit is an oversampling circuit outputting a bit stream and the decimator is a counter clocked at the oversampling frequency, outputting a count of the bit stream pulses in a cycle. In a further exemplary embodiment of the Class D amplifier control circuit, the sigma delta analog to digital converter and the decimator circuit are provided wherein the oversampling frequency is a positive multiple of the switching frequency of the Class D amplifier of a range greater than or equal to 2 and extending up to 1024 or more. In yet another exemplary embodiment, the Class D amplifier control circuit is provided with an oversampling frequency that is a multiple of the switching frequency of the amplifier wherein the multiple is greater than or equal to 128. In a further embodiment, the Class D amplifier control circuit is provided with an oversampling frequency that is a multiple of the switching frequency of the amplifier wherein the multiple is greater than or equal to 256.

In yet another exemplary embodiment, a Class D audio amplifier control circuit is provided, comprising a predriver having outputs for driving a high side driver and a low side driver with signals to produce output voltage signals for driving a loudspeaker; a feedback circuit coupled for receiving one of the output voltage signals and comprising a low pass filter, outputting a filtered feedback signal; an input for receiving an audio input signal; an analog to digital converter coupled to an audio signal input and further coupled to the low pass filtered feedback signal, and outputting a digital value representing the magnitude of an integrated magnitude difference between the audio input signal and the low pass filtered feedback signal; a digital filter coupled to receive the digital value, and to amplify the digital value using programmable coefficients and outputting digital filter output signals; and a digital to analog converter for generating a pulse width modulated output signal with a frequency corresponding to the digital filter output signals, coupled to the predriver circuit. In yet another exemplary embodiment of the above described Class D audio amplifier control circuit, the low pass filter may further include attenuation.

In yet another exemplary embodiment, the above described Class D audio amplifier control circuit is provided wherein the analog to digital converter further comprises a sigma delta analog to digital converter. In another exemplary embodiment, the Class D audio amplifier having a sigma delta analog to digital converter is provided, wherein the sigma delta analog to digital converter further comprises a higher order sigma delta converter outputting a digital stream. In a further exemplary embodiment, the Class D audio amplifier control circuit having a sigma delta analog to digital converter is provided, wherein the sigma delta analog to digital converter further comprises a first order sigma delta analog to digital converter outputting a stream of digital signals.

In yet another exemplary embodiment, the Class D audio amplifier control circuit having a sigma delta analog to digital converter is provided, wherein the sigma delta analog to digital converter further comprises a two branch input switched capacitor circuit that receives the time varying input signal into a first branch and the analog feedback signal into a second branch, which samples the first and second branch during a first phase of a two phase non-overlapping clock signal, and which integrates the sampled voltage during the second phase of the two phase non-overlapping clock signal.

In still another exemplary embodiment, the Class D audio amplifier control circuit is provided with the sigma delta analog to digital converter wherein the sigma delta analog to digital converter further comprises a common mode rejection circuit. In a further exemplary embodiment, the Class D audio amplifier control circuit is provided wherein the analog to digital converter circuit is an oversampling circuit outputting a bit stream. In yet another exemplary embodiment, the Class D audio amplifier control circuit is provided wherein the analog to digital converter circuit is an oversampling circuit having an oversampling frequency that is a positive multiple of the switching frequency of the Class D amplifier in a range of greater than or equal to 2 and extending to 1024 and above.

In yet another exemplary embodiment, the Class D audio amplifier control circuit is provided wherein the analog to digital converter circuit is an oversampling circuit having an oversampling frequency that is greater than or equal to 128. In still another exemplary embodiment, the Class D amplifier control circuit is provided wherein the analog to digital converter circuit is an oversampling circuit having an oversampling frequency that is a positive multiple of the switching frequency of the Class D amplifier of greater than or equal to 256.

In still another exemplary embodiment, the Class D audio amplifier control circuit is provided with the analog to digital converter and further comprising a decimator coupled between the analog to digital converter and the digital filter, for downsampling oversampled digital signals.

In still another exemplary embodiment, the Class D audio amplifier control circuit is provided with the sigma delta analog to digital converter and further comprising a decimator coupled between the sigma delta analog to digital converter and the digital filter, for downsampling oversampled digital signals. In a further exemplary embodiment, the Class D audio amplifier control circuit is provided with the sigma delta analog to digital converter and further comprising a decimator which comprises a counter clocked at the oversampling frequency and counting a number of bits in said bit stream for each cycle.

In still another exemplary embodiment, a Class D audio amplifier control circuit is provided, comprising a predriver having outputs for driving a high side driver and a low side driver with signals to produce output voltage signals for driving a loudspeaker; a feedback circuit coupled for receiving one of the output voltage signals and comprising a low pass filter, outputting a filtered feedback signal; an input for receiving an audio input signal; an analog to digital converter coupled to an audio signal input and further coupled to the low pass filtered feedback signal, and outputting a digital value representing the magnitude of an integrated magnitude difference between the audio input signal and the low pass filtered feedback signal; a digital filter coupled to receive the digital value and to amplify the digital value using programmable coefficients and outputting digital filter output signals; and a digital to analog converter for generating a pulse width modulated output signal with a frequency corresponding to the digital filter output signals, coupled to the predriver circuit; and further comprising noise shaping circuitry coupled to the digital filter for reducing quantization noise caused by the limited resolution of the digital pulse width modulated signal generator.

In yet another exemplary embodiment, an integrated circuit for controlling the drivers of a Class D audio amplifier is provided comprising a predriver circuit having outputs for driving a high side driver and a low side driver with gate control signals to produce output voltage signals for driving a loudspeaker; an input for receiving an audio input signal; a feedback circuit coupled for receiving one of the output voltage signals and comprising a low pass filter, outputting a filtered feedback signal; an input for receiving an audio input signal; an analog to digital converter coupled to an audio signal input and further coupled to the low pass filtered feedback signal, and outputting a digital value representing the magnitude of an integrated magnitude difference between the audio input signal and the low pass filtered feedback signal; a digital filter coupled to receive the digital value, and to amplify the digital value using programmable coefficients, and outputting digital filter output signals; and a digital to analog converter for generating a pulse width modulated output signal with a frequency corresponding to the digital filter output signals, coupled to the predriver circuit.

In yet another exemplary embodiment, the above described integrated circuit is provided wherein the analog to digital converter further comprises a sigma delta converter circuit. In still another exemplary embodiment, the above described integrated circuit is provided with the sigma delta analog to digital converter wherein the sigma delta converter is clocked at an oversampled rate that is a multiple greater than two of the switching frequency of the amplifier circuit. In yet another exemplary embodiment, the above described integrated circuit is provided with the sigma delta analog to digital converter wherein the sigma delta converter is clocked at an oversampled rate that is a multiple greater than or equal to 128. In yet another exemplary embodiment, the above described integrated circuit is provided with the analog to digital converter and further comprising a decimator, the decimator downconverting digital samples from the analog to digital converter to digital outputs clocked at the switching frequency.

In yet another exemplary embodiment, a method is provided for controlling drivers amplifying an audio signal, comprising receiving an audio input signal on an input; receiving a feedback signal from an audio output; low pass filtering the feedback signal to remove harmonics above the human audible range to form a low pass filtered feedback signal; determining the differential signal between the low pass filtered feedback signal and the audio input signal; converting the differential signal to a stream of digital values using oversampling at a multiple of a switching frequency, the multiple being greater than two; receiving the digital values into a decimator that downconverts the digital values to values clocked at the switching frequency; digitally filtering the digital values to obtain a digital output with a predetermined gain and frequency response; converting the digital output to a pulse width modulated signal with a frequency equal to the switching frequency; and outputting a high side driver gating signal and a low side driver gating signal at the switching frequency.

In another exemplary embodiment, the above recited method is provided wherein converting the differential signal to a stream of digital values using oversampling further comprises providing a sigma delta analog to digital converter clocked at the oversampling frequency, and coupled to receive the audio input signal and the low pass filtered feedback signal. In another exemplary method embodiment, the above recited method is provided and further providing a high side driver transistor coupled between a power supply and a first output terminal, and having its gate terminal coupled to the high side driver gating signal; and providing a low side driver coupled between a second output terminal and a ground terminal, and having its gate control signal coupled to the low side gating signal. In still another exemplary embodiment, the above recited method is provided and further comprising coupling a loudspeaker to the first and second output terminals. In yet another preferred embodiment, the above described method further comprises performing noise shaping on the digital values output by the digital filtering prior to the converting to pulse width modulated signals.

The foregoing has outlined rather broadly the features and technical advantages of the present invention in order that the detailed description of the invention that follows may be better understood. This summary section briefly describes certain exemplary embodiments of the invention but the invention is not limited only to these exemplary embodiments. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

The drawings, schematics and diagrams are illustrative, not intended to be limiting but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In some of the illustrative embodiments presented below, a Class D amplifier applied to audio amplification is described. This is an exemplary embodiment and generally the circuits and methods described as embodiments below may be applied to Class D amplifiers without regard to the type of output signal being amplified. Other applications include Class D amplifiers applied to R/F, I/F and ultra-sound signals. These alternative embodiments are also contemplated as additional embodiments of the present invention and are within the scope of the appended claims.

Figure 1:
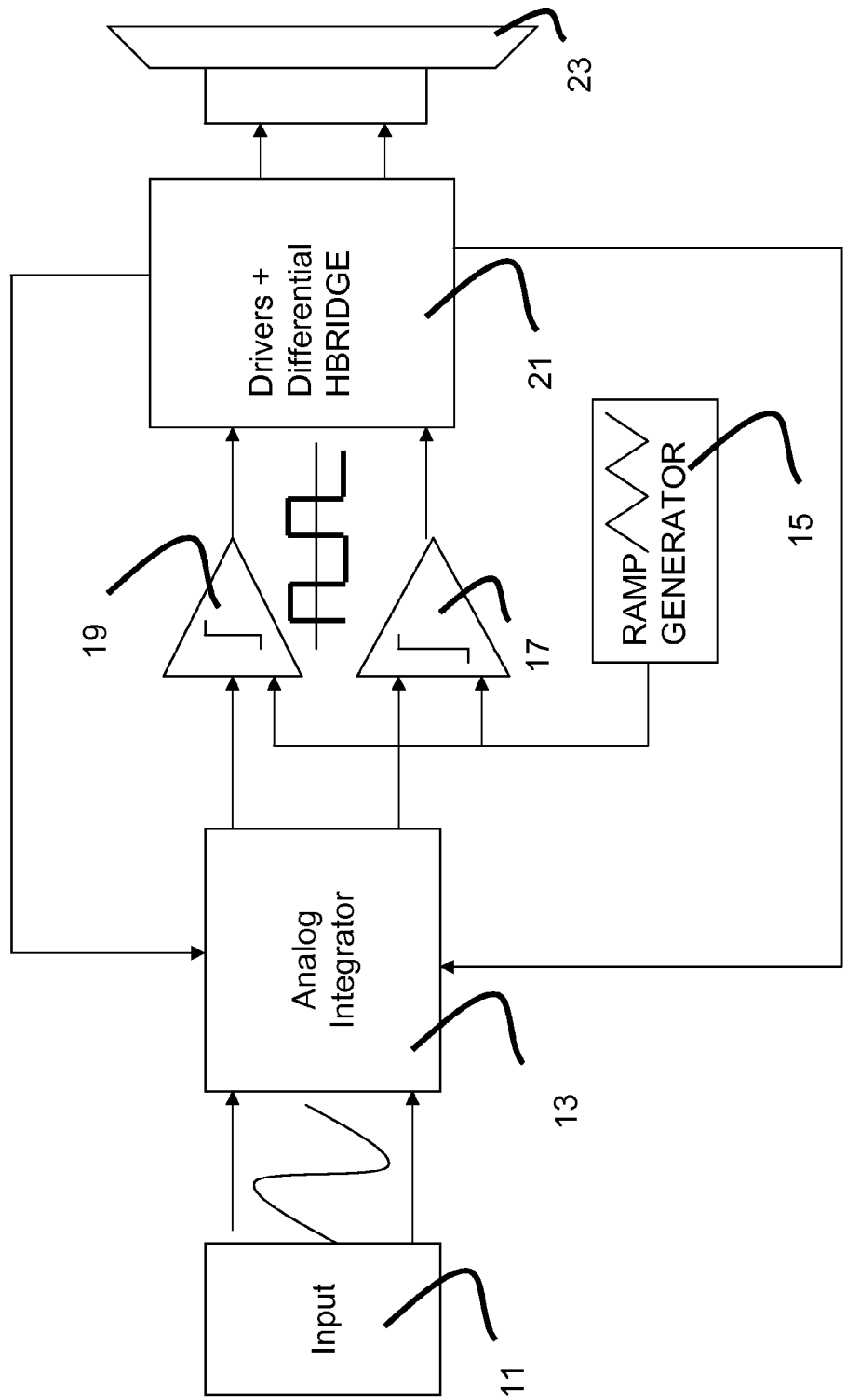
FIG. 1 illustrates a portion of a prior art Class D audio amplifier using an analog ramp generator and integrator circuits.
Figure 2:
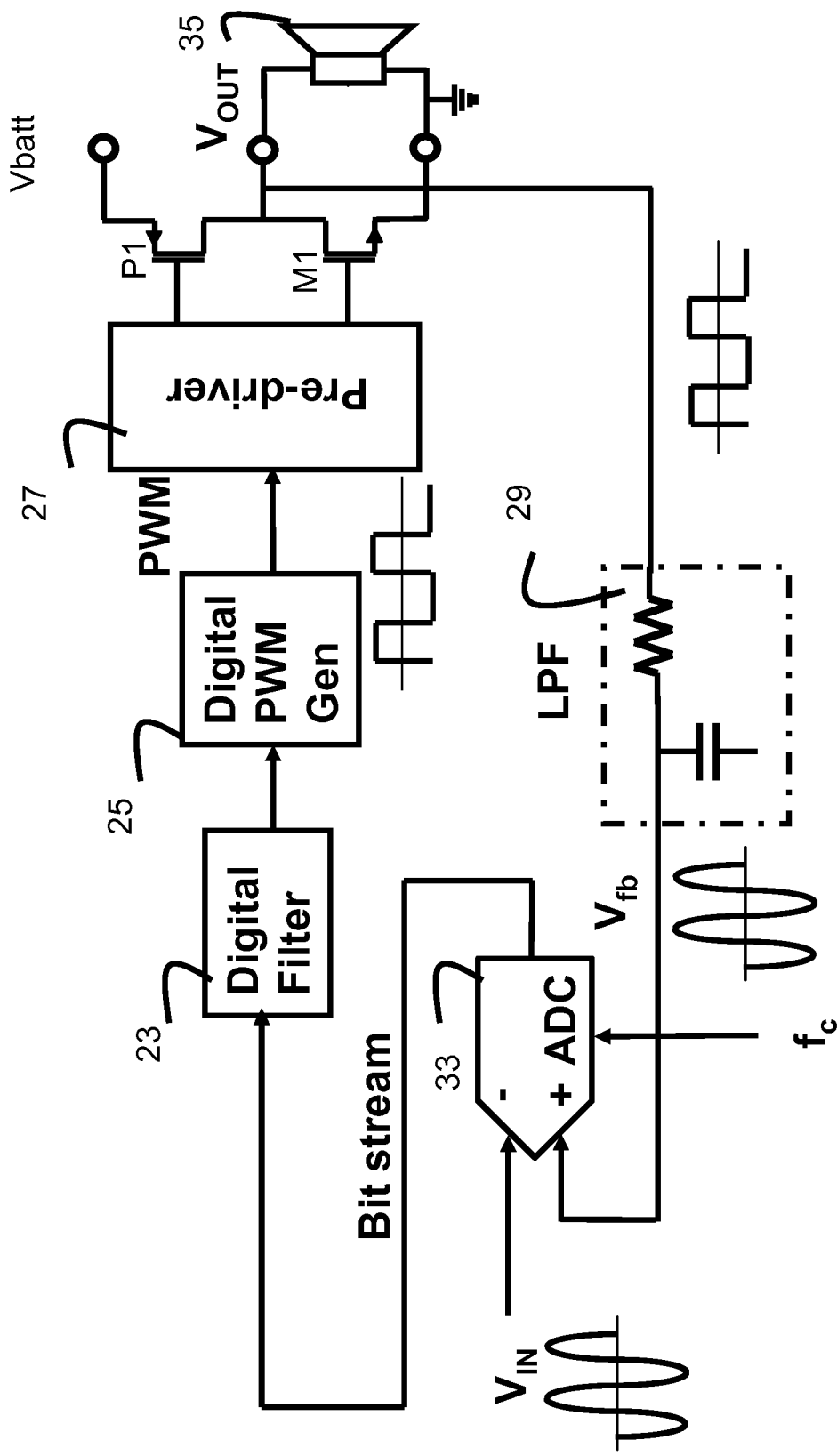
FIG. 2 illustrates in one embodiment of the present invention a Class D audio amplifier and control circuitry.

FIG. 2 depicts in a simplified block diagram an embodiment of a Class D amplifier incorporating features of the invention. In FIG. 2, a feedback loop is utilized to control the frequency response of the amplifier. A feedback signal from the output Vout is input into low pass filter 29, which receives the pulse width modulated, constant frequency output signal, in the form of a square wave as shown, and the low pass filter 29 outputs a sinusoidal signal of the same frequency. This feedback signal from the low pass filter output is input to one input terminal of the analog to digital converter ADC 33. Importantly, the ADC 33 is a differential ADC, the difference or error between the input signal Vin and the feedback signal Vfb is converted to a digital signal. Because these two signals are closely valued, the difference signal will be a small voltage from peak to peak, say 10 to 50 millivolts at most. In contrast, if the input signal were received in an open loop configuration, the signal swing could be from the ground or 0 Volts level to the supply of the battery, Vbatt. Because the ADC 33 circuit will preferably be implemented with a low level supply voltage, the use of the differential or error signal makes it possible to implement a simple and space efficient circuit. In contrast, if the signal swing exceeds the supply voltage by a large amount, the implementation of the ADC becomes very difficult and requires a large area and many components to achieve.

The output of the ADC 33 is a digital output stream of "1"s and "0"s, of which the running average value matches that of the differential error signal taken between the analog input signal Vin and the feedback input from the low pass filter 29. The digital weighted signal is input to the digital filter 23. Importantly, the use of digital filter 23 allows the feedback control loop to be tuned to the analog components of the amplifier or even adaptively changed. This is an important advantage of the amplifier of FIG. 2. The digital filter coefficients may be adaptively configured so as to maintain loop stability and to ensure the amplifier provides the desired frequency response. This adaptation is accomplished by allowing the poles and zeros in the loop response characteristic to be changed simply by changing the coefficients of the digital filter. The output of the digital filter, in this non-limiting exemplary embodiment, is then input to the digital PWM generator, which outputs a pulse width modulated, constant frequency signal at the switching frequency $f_s$, the width of the pulses corresponding to the value of the digital input signal. The digital PWM generator 25 is therefore outputting a signal in which the information is carried as a variable pulse width, prior to passing it on to the driver circuitry.

The PWM signal input to the pre-driver circuit 27 is then used to generate the gating control signals to the high side driver P1 and the low side driver N1 in FIG. 2. In this exemplary embodiment the drivers are PMOS and NMOS power transistors as shown; however, alternative embodiments could use two NMOS driver transistors, for example. Other drivers could be bipolar transistors, for example. The gating control signals are formed so as to prevent shoot through, with a short transition or "dead time" between the high cycles of the gate signals to P1 and N1, respectively as is known in the art.

Speaker 35 is shown coupled to the output node Vout. Vout is a pulse width modulated essentially square signal, however the speaker coil is an inductor which provides some low pass filtering. Although not explicitly shown in FIG. 2, for clarity, additional passive elements may be used between the output and the speaker 35 to further tailor the sound that is produced, as desired. In the simplest embodiments, this analog filtering can be omitted, in more complicated embodiments, there may be several passive components between the output node Vout and the speaker to improve the sound heard from the speaker. Note that for the non-limiting audio amplifier embodiments, the speaker is a natural low pass filter in that it rejects signals in the range above the audible spectrum, around about 20 Hz-20 kHz, thus higher frequency harmonics are simply rejected.

In the related patent application Ser. No. 12/197,790, herein incorporated by reference, it was shown that a similar control loop can be used along with an appropriate LC (inductor/capacitor) circuit to implement embodiments that provide excellent DC-DC converter circuits. In the embodiment of the present invention, these concepts are extended further to embodiments directed at the implementation of low frequency Class D amplifiers with excellent characteristics for circuit implementation in an advanced semiconductor process such as a process of minimum feature size of 45 nanometers or less, even though the processes are tailored primarily for digital circuitry. Although this exemplary implementation has strong advantages for use in semiconductor processes with very small minimum feature sizes and low voltage internal power supplies, it can also be advantageously used in applications using larger geometry semiconductor processes. In some embodiments, the Class D amplifiers may be audio amplifiers.

Figure 3:
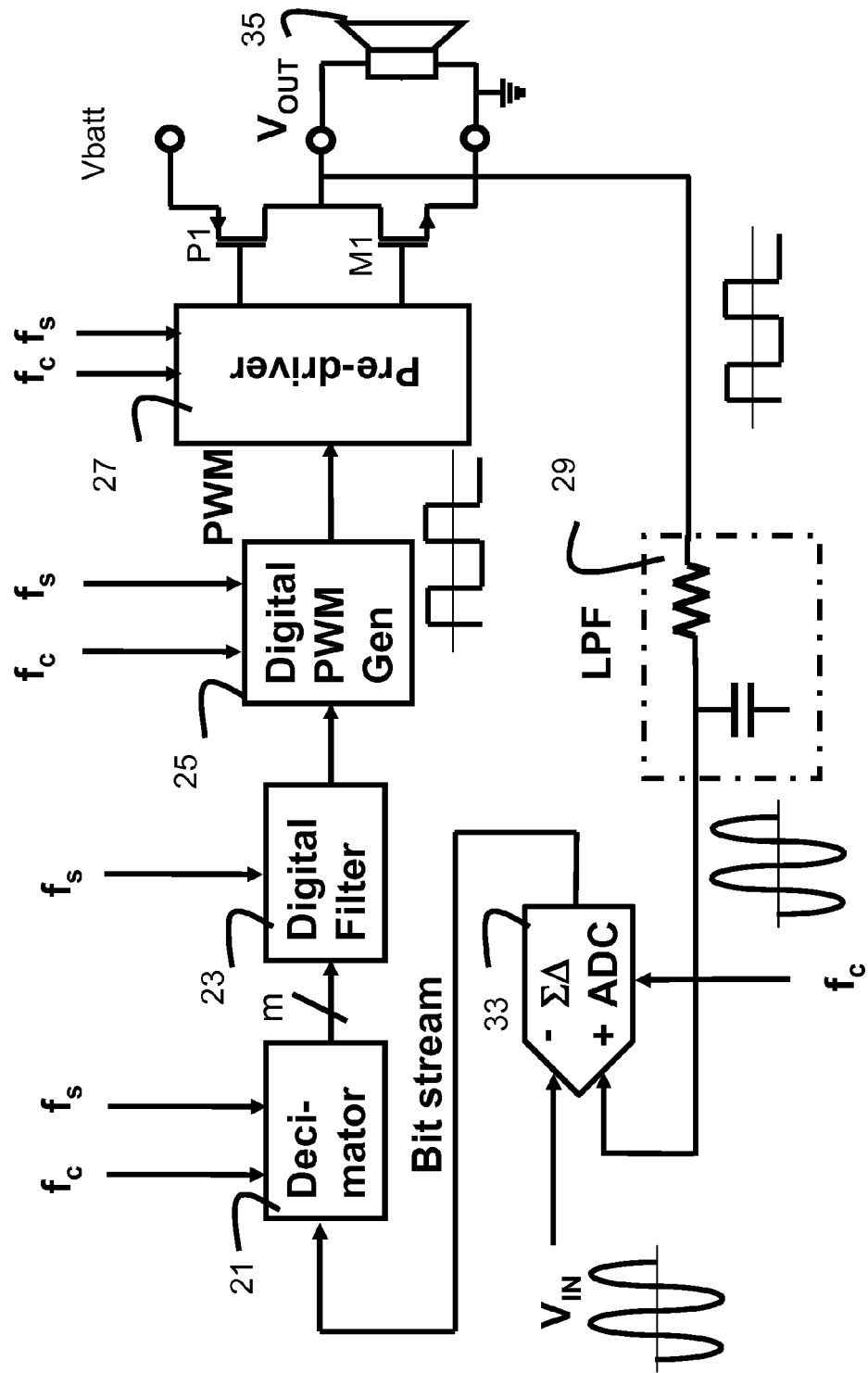
FIG. 3 illustrates in another embodiment of the present invention a Class D audio amplifier and control circuitry.

FIG. 3 illustrates an alternative preferred embodiment of the Class D amplifier. As shown in FIG. 3, the ADC converter 33 is conveniently implemented as a sigma delta converter 33. The sigma delta converter allows for a simple switched capacitor design to provide rejection of the common mode of the incoming signals, while still providing the differential gain necessary for the conversion to the digital domain.

The sigma delta analog to digital converter 33 outputs a digital stream. This stream is a result of a high rate of oversampling. Most Class D amplifiers have switching frequency $f_s$ of around 400 kHz. In the embodiment of FIG. 2, which in this example is presented for illustration and not to limit the invention and the particular values chosen do not limit the scope of the invention or the scope of the appended claims, 256× oversampling is chosen as a convenient sampling frequency. Of course, other sampling frequencies may be used so long as minimal sampling frequency of twice the Nyquist rate is maintained so that the input signal may be accurately reproduced. Example useful oversampling ratios are from 2 to 1024 and even greater, with 128 and 256 being most typical. In the 256× case with a 400 Mhz switching frequency $f_s$, clock $f_c$ is then 102.4 Mhz (256×400 kHz). Thus, for each clock cycle $f_s$, the exemplary ADC puts out 256 digital values. For a particular case where a 1-bit sigma delta converter is used, these digital values are 1 bit values, but other sigma delta topologies may also be used with a greater number of bits. If the sampling frequency were a lower multiple of the switching frequency, for example 128×, then 128 samples would be output.

Because the ADC integrates the differential error signals at the input, which are then quantized, the output bit stream represents a running average of the difference between the input and the previous output Vout. A simple comparator quantizer samples the differential, integrated signal within the ADC and puts out the digital bit stream as a 256 digital sample stream.

This arrangement allows for convenient downsampling by a decimator 21. The decimator 21 is arranged to put out a binary coded digital signal (here 8 bits are chosen but other values could be used), that represents the weighted average value of the samples over one cycle (of the 400 kHz period $f_s$, in this example, although other $f_s$ frequencies may be used). Advantageously, in the exemplary circuit embodiment shown, a simple digital counter may be used as the decimator 21. The counter counts the number of "1"s in the previous 256 samples and thus outputs an 8 bit value between 0 and 255. This is in the nature of an "accumulate and dump" decimating or downsampling operation. Note that other circuit forms could be used for a decimator, but given that the manufacturing processes used in present integrated circuit technologies are often specifically optimized for digital circuit blocks such as a counter, the use of a simple counter is particularly advantageous for this particular embodiment.

The output of the decimator 21 is a simple m bit (here 8 bits are used) digital value that is input to the digital filter 23. The digital filter 23 is a simple and cost effective digital filter and any one of several known filter circuits may be used. In advantageous embodiments, the coefficients of the filter 23 may be adapted "on the fly", or tuned after production. In this fashion, the filter coefficients may be tailored for an application to provide the DC gain, or attenuation, needed for a particular application, and to ensure the control loop including the digital filter is stable and remains stable over temperature and process variations, voltage variations, etc. The adaptive changes to the coefficients may be done by programming these coefficients to change the loop response, that is, to move the poles and zeros, in order to maintain the stability and obtain the DC gain desired in the loop transfer function.

Figure 4:
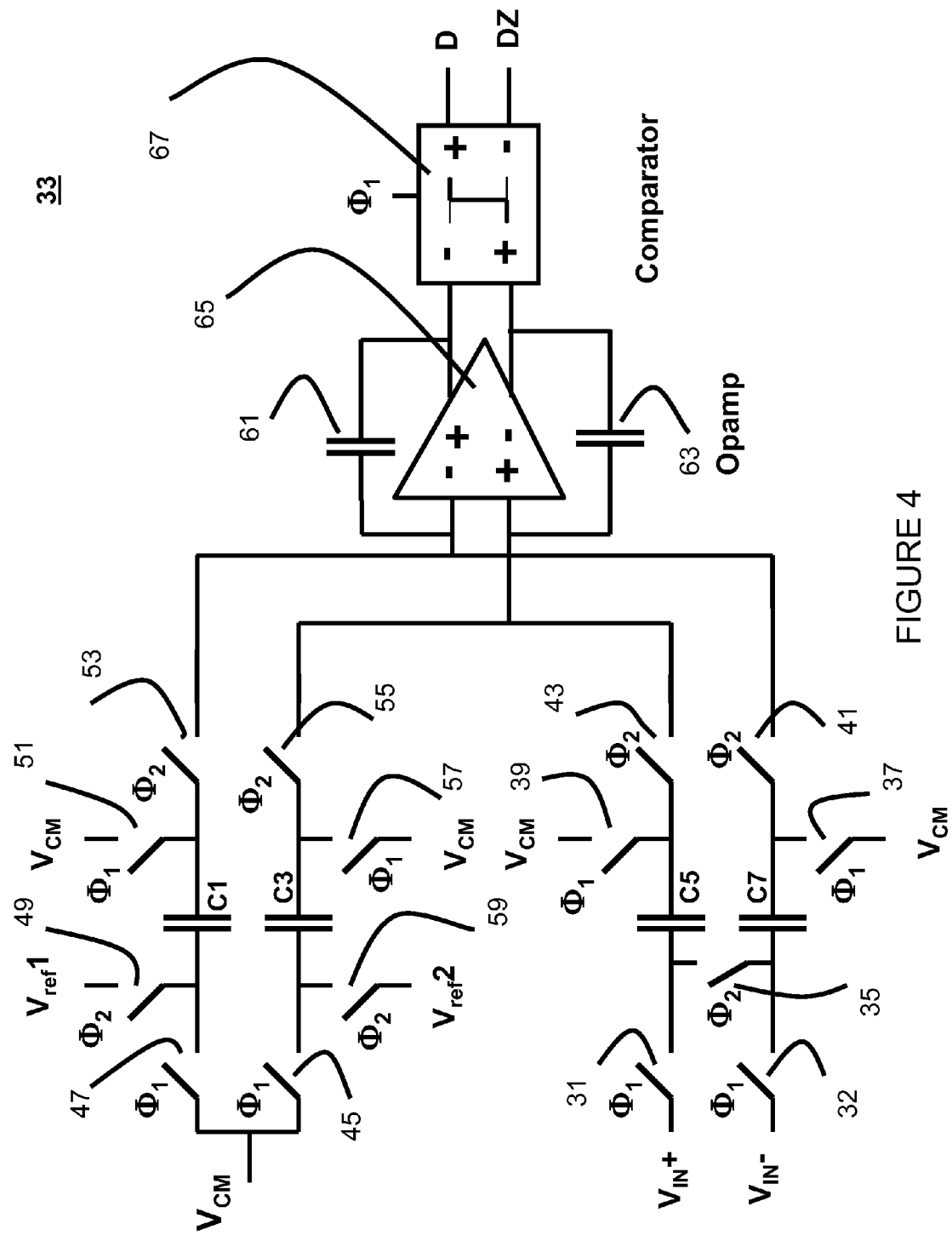
FIG. 4 illustrates an implementation embodiment for an analog to digital converter that may be used in the audio amplifier of FIG. 3.

FIG. 4 depicts an example implementation of another illustrative preferred embodiment, for the sigma delta ADC converter to be used as ADC 33. In FIG. 4, the inputs Vin+ and Vin− are input into a two branch switched capacitor matrix that is formed by switches 31, 32, 35, 37, 39, 41, and 43. The switches are clocked by either of clock $\phi_1$ or clock $\phi_2$, which are non overlapping clocks each clocked at a sampling frequency $f_c$ of, in this example, 102.4 Mhz. Capacitors C5 and C7 are coupled to the switches 31 and 32 to sample the voltages Vin+ and Vin− when the clock phi1 is at a high level. The other terminal of capacitors C5 and C7 are each coupled to voltage Vcm when the I1 clock is active. Similarly, a switched matrix comprising switches 45, 47, 49, 51, 53, 55, 57 and 59 samples a common mode voltage Vcm onto capacitors C1 and C3 during the period when clock phi1 is active. Because the terminals of both C1 and C3 are at the same voltage during the time I1 is active, these capacitors are essentially zeroed out.

The capacitor matrix that controls the voltages on C1 and C3 will also input voltages $V_{ref}1$ and $V_{ref}2$ onto the capacitors when clock $\phi_2$ is active. Clock $\phi_2$ will be active in an alternating and non-overlapping fashion with clock $\phi_1$. Switches 49, 53, 55, and 59 will operate together to couple these capacitors to $V_{ref}1$ and $V_{ref}2$. In this fashion, the upper branches provide a reference voltage to be summed with (including adding and subtracting as is described later) the input voltages.

The whole sigma-delta converter has two branches. The lower branch calculates the difference between the Vin+ and Vin− and rejects the common mode. The upper branch either adds, in fully differential sense, or subtracts the reference voltage, based on the decision of the comparator.

The quantizing function of the ADC 33 is performed by the simple comparator 67 which is clocked by phi1. The output is a digital output stream that is at frequency $f_c$. Thus, the output signal is a 1 or a 0 depending on the differential input signal, digitizing the averaged differential error signal output by the two branch integrator circuit.

Figure 5:
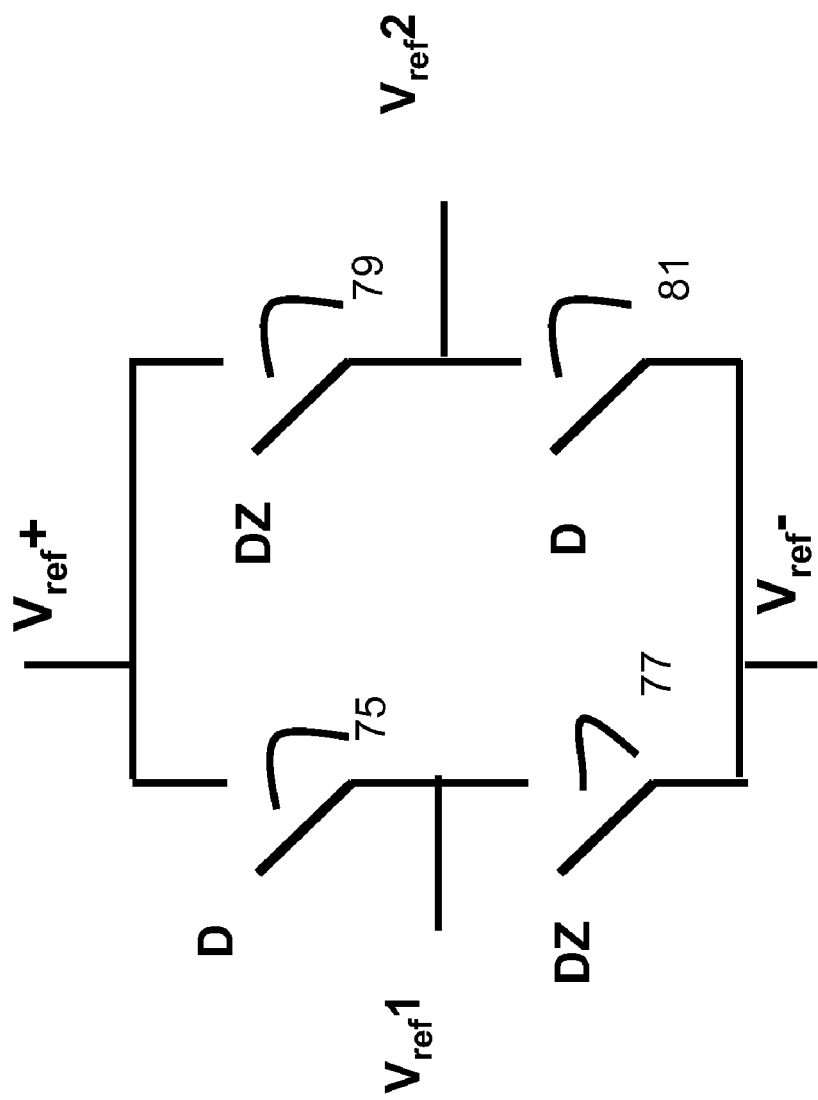
FIG. 5 illustrates a reference voltage circuit embodiment that operates with the analog to digital converter of FIG. 3.

FIG. 5 depicts the Vref selection circuit used to set the voltage in the upper branches of the circuit of FIG. 4. Because the selection depends on the value of D and DZ, the output of the quantizer, here comparator 67, there is feedback in the sigma delta circuit. This is important because the selection of $V_{ref}1$ and $V_{ref}2$ needs to be made in a manner that causes the output of the sigma delta ADC to maintain a value within certain bounds. Because the integrator capacitors 61 and 63 in FIG. 4 are never cleared, if the values input to the op amp 65 were always positive, the output would constantly increase. The use of the circuit in FIG. 5 changes the voltages to $V_{ref}1$ and $V_{ref}2$ in FIG. 4 so that the prior decision of the quantizer 67 will cause the reference voltages to change, thus forcing the output back to the average and preventing the output from continuing to increase. Gates 75, 77, 79 and 81 operate in a similar manner so that if the prior "D" output was positive, then the reference voltage for the next summing operation at the input to the op amp will be negative, and thus reduce the output of the op amp. Since the quantizer 67 may be a 1 bit quantizer in this particular embodiment, only the relative difference between the two signals coming out of the op amp matters, the magnitude is not considered per se as the comparator 67 looks at the difference. It is quite feasible however to use a multi-bit, such as a 2 or 3 bit, sigma delta as well. The 1 bit example is presented as an illustrative, non-limiting example.

There are several advantages to the approach used with the exemplary embodiments. The range of input signals is kept very small as only the error signal is converted. This further means that a very small reference voltage, between 10 and 50 millivolts differential, may be used. In one embodiment, an input signal equal to $V_{ref}+$ will result in a steady stream of "1"s being output, while an input signal equal to $V_{ref}-$ will result in a steady stream of "0"s being output. Because both the input signal and the reference voltage are small, the input voltage range of the amplifier can be small. Also, because the output of the integrator never goes more than Vref volts away from the initial value, the output voltage range of the amplifier can be small as well. Further, since the comparator only compares two differential outputs of the amplifier, the linearity of the amplifier gain is not critical. Further, because of these characteristics, the design of the amplifier is significantly simplified, an important advantage when the circuit is to be implemented in an advanced semiconductor process where the supply voltage is typically kept around 1 Volt, and trending lower. Advantages from the use of the embodiments of the invention are also attained for larger semiconductor process technologies and the embodiments, and the appended claims, are not limited to the smaller process technologies, but the embodiments have some particular benefits in advanced semiconductor process node implementations.

The circuit of FIG. 5 thus provides a reference for each cycle that depends on the prior result, and thus keeps the accumulating charge from constantly increasing in the summing or integrating capacitors of FIG. 4. In this manner, the quantized output will be a digital output stream indicating the average of the difference signal over time. The oversampling technique provides a resolution of the ADC that is quite high, without the need for precision components and analog passive components of the ADC converters of the prior art.

Figure 6:
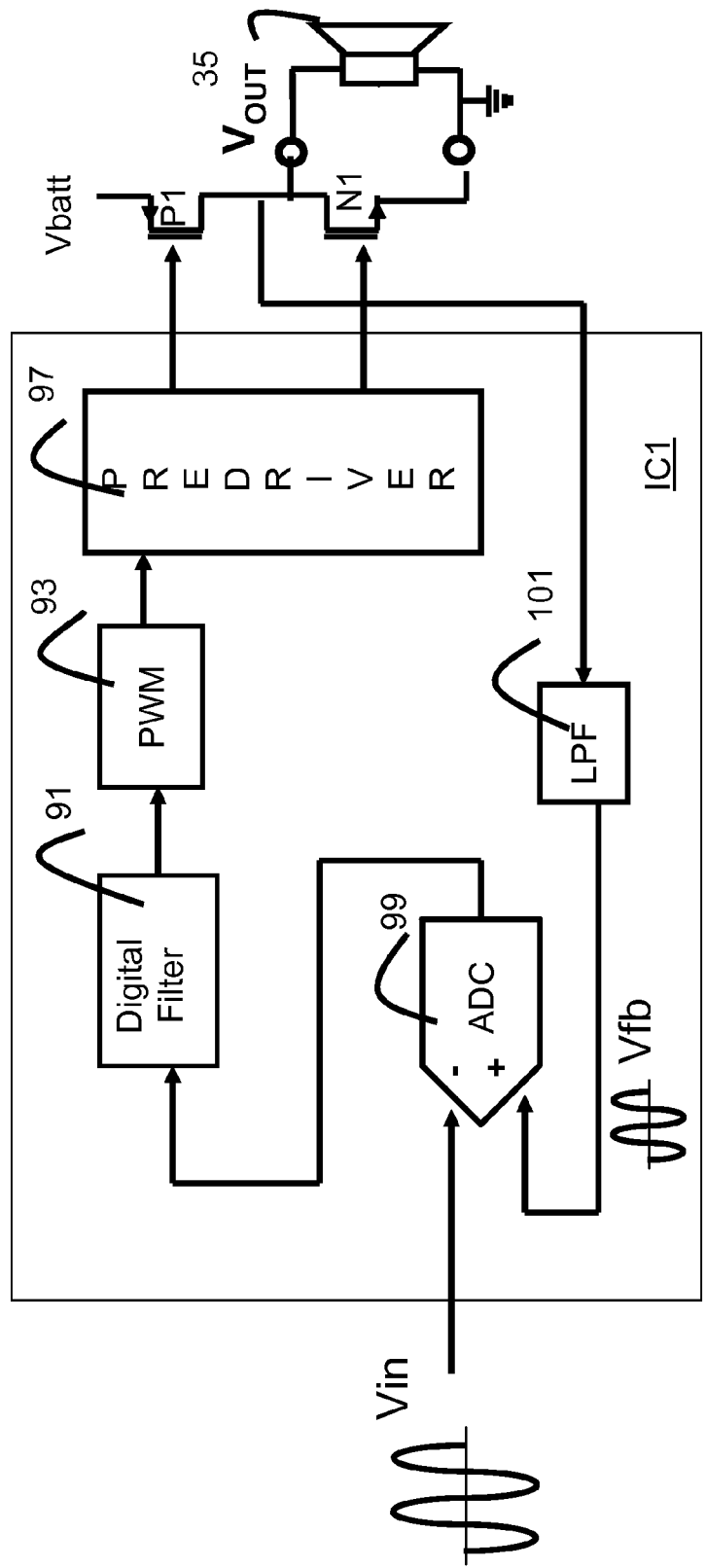
FIG. 6 illustrates another exemplary embodiment in a simplified block diagram of an integrated circuit incorporating features of the invention.

FIG. 6 depicts in another exemplary embodiment a simple block diagram of an integrated circuit implementing the control circuit of the invention. In FIG. 6, the IC1 integrates the circuits of FIG. 2, and a digital filter 91, digital PWM 93, predriver 97, low pass filter LPF 101, and analog to digital converter ADC 99 are implemented on a single IC. In a preferred embodiment, the IC is manufactured in a sub micron semiconductor process, and may be implemented in a current production node such as 45 nanometer, 32 nanometer or smaller minimum feature size with the correspondingly low core supply voltages. However in other preferred embodiments, the IC may be manufactured in any semiconductor process and significant benefits and advantages will still be attained.

Figure 7:
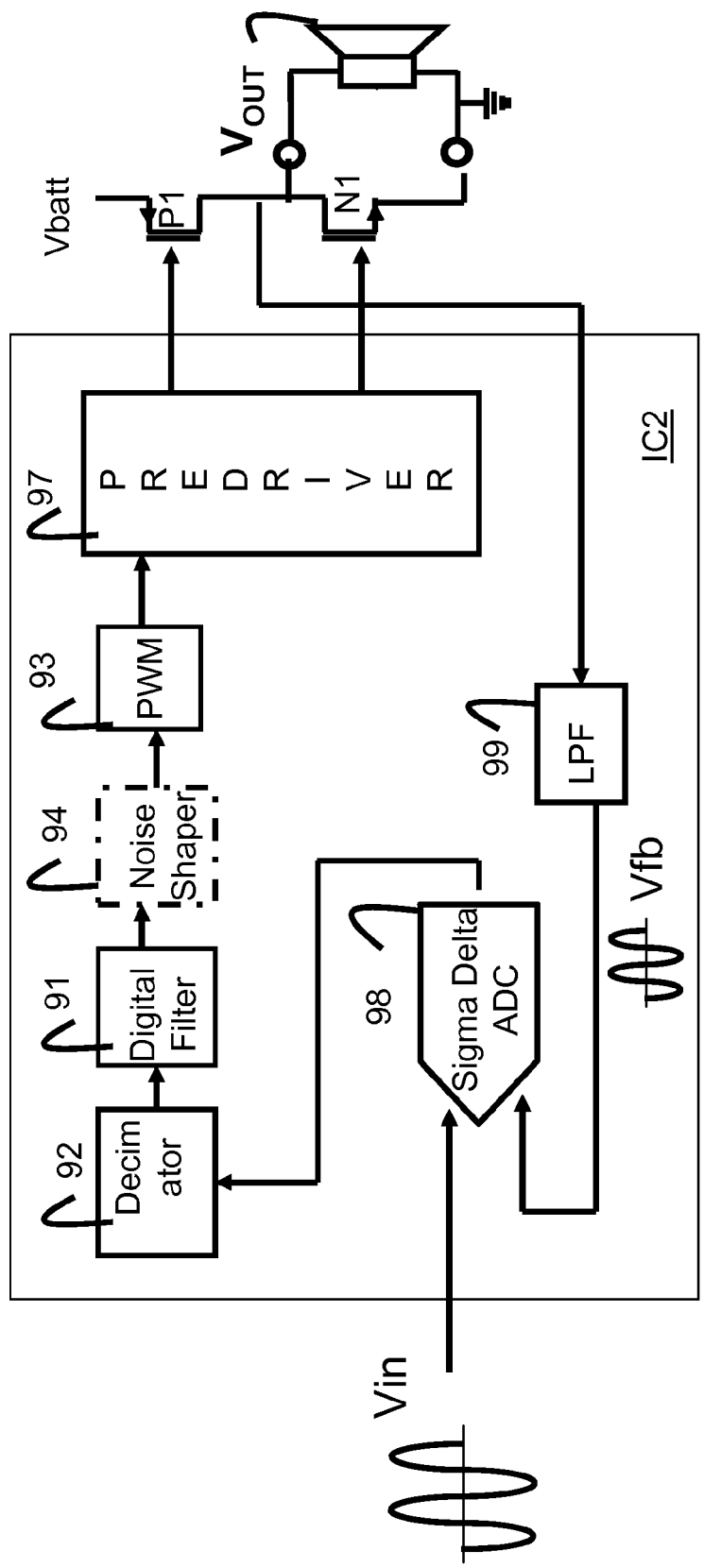
FIG. 7 illustrates in another exemplary embodiment in a simplified block diagram an alternate form of an integrated circuit incorporating embodiments of the present invention.

FIG. 7 depicts in another exemplary embodiment an integrated circuit IC2 that incorporates the circuits of FIG. 3, for example, IC2 has decimator 92, digital filter 91, digital PWM 93, predriver 97, low pass filter 99 and sigma delta ADC 98. A noise shaping circuit 94 is also optionally shown. If desired, this noise shaper can improve the audio signal output by shaping the quantization noise that results from the finite bit resolution of the digital pulse width modulator generator 93. High frequency noise content is subsequently rejected by the load and/or feedback filter, thereby improving the amplifier performance. In particular, this noise shaping can result in reduced noise and reduced tones in the load.

The integrated circuits shown are but example implementations. The invention may be embodied in a method of operating an off the shelf or programmable IC such as a DSP. In this embodiment, a method would comprise receiving an analog input signal, comparing it to a feedback signal, performing an analog to digital conversion on the difference or error signal, inputting the digital values to a digital filter, performing a digital to analog conversion, and outputting gating signals to drive the high and low side drivers of a Class D amplifier. In another exemplary embodiment method, the analog to digital conversion would be performed in an oversampled sigma delta converter and a decimation would be performed prior to the digital filter.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A Class D amplifier control circuit, comprising:
an input for receiving a time varying input signal having a frequency of less than 100 kHz;
a feedback path for coupling an analog output signal;
a low pass filter coupled to the feedback path and outputting a low pass filtered feedback signal;
an analog to digital converter coupled to the input and further coupled to the low pass filtered feedback signal and outputting a digital value representing the magnitude of a difference between the input signal and the low pass filtered feedback signal;
a digital filter coupled to receive the digital value and to amplify the digital value using programmable coefficients and outputting digital filter output signals;
a digital PWM generator for generating a pulse width modulated output signal with a frequency corresponding to the digital filter output signals; and
a predriver circuit coupled to the pulse width modulated output signal and outputting driver gate control signals for a high side and low side driver of the Class D amplifier.

2. The Class D amplifier control circuit of claim 1, wherein the frequency of the input signal is about 0 to 20 kilohertz in the human audible frequency range.

3. The Class D amplifier control circuit of claim 1, wherein the analog to digital converter comprises a sigma delta analog to digital converter.

4. The Class D amplifier control circuit of claim 3, further comprising a decimator coupled between the sigma delta analog to digital converter and the digital filter.

5. The Class D amplifier control circuit of claim 3, wherein the sigma delta analog to digital converter further comprises:
a two branch input switched capacitor circuit that receives the time varying input signal into a first branch and the analog feedback signal into a second branch, which samples the first and second branch during a first phase of a two phase non-overlapping clock signal and which integrates a sampled voltage during the second phase of the two phase non-overlapping clock signal.

6. The Class D amplifier control circuit of claim 3, wherein the sigma delta analog to digital converter further comprises circuitry rejecting the common mode of incoming signals while providing the differential gain necessary for the conversion of the signals to a digital domain.

7. The Class D amplifier control circuit of claim 4, wherein the analog to digital converter is an oversampling circuit outputting a digital output stream and the decimator is a counter clocked at an oversampling frequency and outputting a count of bit stream pulses in a cycle.

8. The Class D amplifier control circuit of claim 7, wherein the oversampling frequency is a positive multiple of the switching frequency of the Class D amplifier of greater than 2.

9. The Class D amplifier control circuit of claim 8, wherein the multiple is greater than or equal to 128.

10. The Class D amplifier control circuit of claim 9, wherein the multiple is greater than or equal to 256.

11. A Class D audio amplifier circuit, comprising:
a predriver having outputs for driving a high side driver and a low side driver with signals to produce output voltage signals for driving a loudspeaker;
a feedback circuit coupled for receiving one of the output voltage signals and comprising a low pass filter, outputting a filtered feedback signal;
an input for receiving an audio input signal;
an analog to digital converter coupled to an audio signal input and further coupled to the low pass filtered feedback signal, and outputting a digital value representing the magnitude of an integrated magnitude difference between the audio input signal and the low pass filtered feedback signal;
a digital filter coupled to receive the digital value, and to amplify the digital value using programmable coefficients, and outputting digital filter output signals; and
a digital PWM generator for generating a pulse width modulated output signal with a frequency corresponding to the digital filter output signals, coupled to the predriver circuit.

12. The Class D audio amplifier circuit of claim 11, wherein the analog to digital converter further comprises a sigma delta analog to digital converter.

13. The Class D audio amplifier circuit of claim 12, wherein the sigma delta analog to digital converter further comprises a first order sigma delta analog to digital converter outputting a bit stream of digital signals.

14. The Class D audio amplifier circuit of claim 12, wherein the sigma delta analog to digital converter further comprises:
a two branch input switched capacitor circuit that receives the time varying input signal into a first branch and the analog feedback signal into a second branch, which samples the first and second branch during a first phase of a two phase non-overlapping clock signal and which integrates the sampled voltage during the second phase of the two phase non-overlapping clock signal.

15. The Class D audio amplifier circuit of claim 14, wherein the sigma delta analog to digital converter further comprises circuitry rejecting the common mode of incoming signals while providing the differential gain necessary for the conversion of the signals to the digital domain.

16. The Class D audio amplifier circuit of claim 14, wherein the analog to digital converter circuit is an oversampling circuit outputting a digital output stream.

17. The Class D audio amplifier circuit of claim 16, wherein the oversampling circuit has an oversampling frequency that is a positive multiple of the switching frequency of the Class D amplifier of greater than 2.

18. The Class D audio amplifier circuit of claim 17, wherein the multiple is greater than or equal to 128.

19. The Class D audio amplifier circuit of claim 17, wherein the multiple is greater than or equal to 256.

20. The Class D audio amplifier circuit of claim 12, further comprising a decimator coupled between the sigma delta analog to digital converter and the digital filter for downsampling oversampled digital signals.

21. The Class D audio amplifier circuit of claim 16, further comprising a decimator coupled between the sigma delta analog to digital converter and the digital filter for downsampling oversampled digital signals.

22. The Class D audio amplifier circuit of claim 20, wherein the decimator comprises a counter clocked at an oversampling frequency and counting a number of bits in said bit stream for each cycle.

23. The Class D audio amplifier circuit of claim 21, further comprising noise shaping circuitry coupled to the digital filter for reducing distortion due to the resolution of the pulse width modulation in the digital filter outputs.

24. An integrated circuit for controlling the drivers of a Class D amplifier, comprising:
a predriver circuit having outputs for driving a high side driver and a low side driver with gate control signals to produce output voltage signals for driving a load;
an input for receiving an input signal;
a feedback circuit coupled for receiving one of the output voltage signals and comprising a low pass filter, outputting a filtered feedback signal;
an analog to digital converter coupled to a signal input and further coupled to the low pass filtered feedback signal, and outputting a digital value representing the magnitude of an integrated magnitude difference between the input signal and the low pass filtered feedback signal;
a digital filter coupled to receive the digital value, and to amplify the digital value using programmable coefficients, and outputting digital filter output signals; and
a digital PWM generator for generating a pulse width modulated output signal with a frequency corresponding to the digital filter output signals, coupled to the predriver circuit.

25. The integrated circuit of claim 24, wherein the analog to digital converter further comprises a sigma delta converter circuit.

26. The integrated circuit of claim 25, wherein the sigma delta converter is clocked at an oversampled rate that is a multiple greater than two of the switching frequency of the Class D amplifier.

27. The integrated circuit of claim 26, wherein the multiple is greater than or equal to 128.

28. The integrated circuit of claim 25, further comprising a decimator circuit coupled between the analog to digital converter and the digital filter, the decimator downconverting digital samples from the analog to digital converter to digital outputs clocked at the switching frequency.

29. The integrated circuit of claim 24, wherein the input signal is an audio input signal.

30. A method for amplifying an audio signal, comprising:
receiving an audio input signal on an input;
receiving a feedback signal from an audio output;
low pass filtering the feedback signal to remove harmonics above about 20 kilohertz in frequency to form a low pass filtered feedback signal;
determining the differential signal between the low pass filtered feedback signal and the audio input signal;
converting the differential signal to a stream of digital values using oversampling at a multiple of a switching frequency, the multiple being greater than two;
receiving the digital values into a decimator that downconverts the digital values to values clocked at the switching frequency;
digitally filtering the digital values to obtain a digital output with a predetermined gain;
modulating the digital output to a pulse width modulated signal with a frequency equal to the switching frequency; and
outputting a high side driver gating signal and a low side driver gating signal at the switching frequency.

31. The method of claim 30, wherein converting the differential signal to a stream of digital values using oversampling further comprises:
providing a sigma delta analog to digital converter clocked at the oversampling frequency and coupled to receive the audio input signal and the low pass filtered feedback signal.

32. The method of claim 31, further comprising:
providing a high side driver transistor coupled between a power supply and an output terminal, and having its gate terminal coupled to the high side driver gating signal; and
providing a low side driver transistor coupled between the output terminal and a ground terminal, and having its gate control signal coupled to the low side driver gating signal.

33. The method of claim 32, further comprising coupling a loudspeaker to the output terminal and the ground terminal.

* * * * *

UNITED STATES PATENT AND TRADEMARK OFFICE
CERTIFICATE OF CORRECTION

PATENT NO. : 7,990,215 B2
APPLICATION NO. : 12/858310
DATED : August 2, 2011
INVENTOR(S) : Soenen et al.

It is certified that error appears in the above-identified patent and that said Letters Patent is hereby corrected as shown below:

In Col. 12, line 64, claim 2, delete "the human audible".
In Col. 14, line 9, claim 16, delete "circuit".
In Col. 14, line 58, claim 25, delete "circuit".

Signed and Sealed this
Eighth Day of November, 2011

David J. Kappos
*Director of the United States Patent and Trademark Office*